May 15, 1962 L. J. NEELANDS ET AL 3,035,231
FREQUENCY DIFFERENCE DISCRIMINATOR
Filed Jan. 16, 1959 2 Sheets-Sheet 1

INVENTORS:
LEWIS J. NEELANDS,
CALVIN R. WOODS,
BY T. E. Kristofferson
THEIR ATTORNEY.

INVENTORS:
LEWIS J. NEELANDS,
CALVIN R. WOODS,

BY T. E. Kristofferson
THEIR ATTORNEY.

United States Patent Office 3,035,231

Patented May 15, 1962

3,035,231

FREQUENCY DIFFERENCE DISCRIMINATOR

Lewis J. Neelands, Cazenovia, and Calvin R. Woods, Dewitt, N.Y., assignors to General Electric Company, a corporation of New York Filed Jan. 16, 1959, Ser. No. 787,306
7 Claims. (Cl. 329—124)

This invention relates to an improved frequency difference discriminator, and more particularly to a frequency difference discriminator having an improved control of the noise content in the output or improved characteristics of the discriminator.

Prior art frequency difference discriminators have employed a mixer in each of two channels fed by a local oscillator which feeds one channel (e.g. the inphase channel) directly and the other channel (e.g. the quadrature channel) through a phase shifting device. An input signal is also applied to both of the mixers. The output of one of the mixers is differentiated and compared with the undifferentiated output of the other mixer in a phase detector or multiplier. One of the problems involved in the use of this circuit is that the high frequency components, due to noise in the inphase and quadrature channels, beat together in the phase detector or multiplier and result in low frequency noise in the output. Accordingly, it is an object of this invention to reduce this low frequency noise in the phase detector output of a frequency difference discriminator employing simplified circuitry.

It is another object of this invention to provide an improved frequency difference discriminator employing circuitry for providing an improved discriminator input-output characteristic.

In carrying out the invention in one form thereof, a frequency difference discriminator, as described above in the reference to prior art, is modified to include filtering or wave-shaping networks in both channels to provide for differentiation in one channel and removal of the high frequency component in at least the other channel in order to reduce beating in the phase detector and resulting low frequency noisy output. The filters in the two channels may employ various characteristics in order to further modify the input-output characteristics of the discriminator.

The novel features, which are believed to be characteristic of the invention, are set forth with particularity in the appended claims. The invention itself, however, together with further objects and advantages thereof can best be understood by reference to the following description taken in connection with the accompanying drawings in which:

Figure 1:
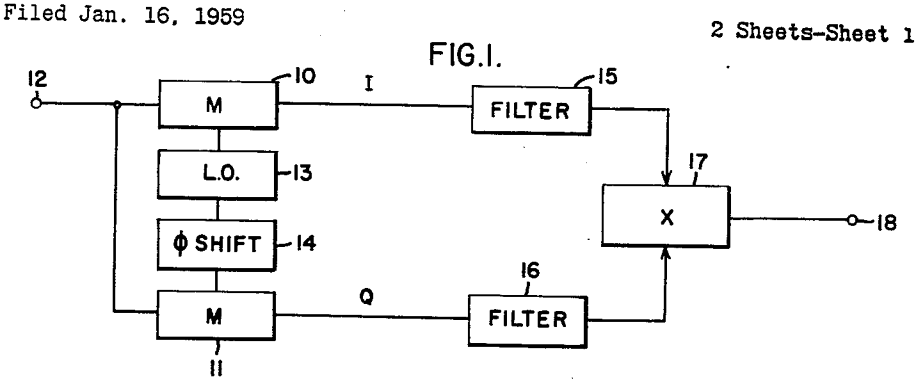
FIG. 1 is a block diagram of one embodiment of the improved frequency difference discriminator.
Figure 3:
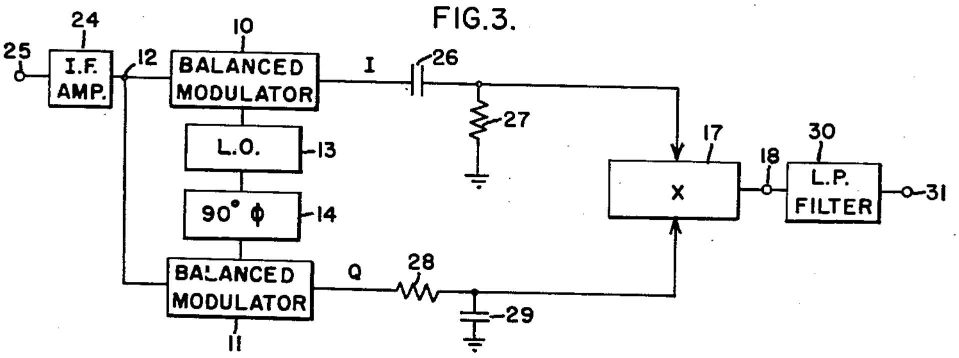
FIG. 3 is a diagram, partly in block and partly in schematic, of another modification of the improved frequency difference discriminator.
Figure 5:
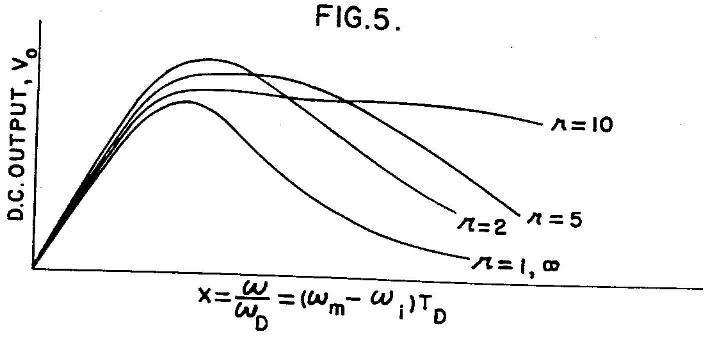

FIG. 4*a* thru 4*d* are diagrams showing some of the signals present at various points in the circuits of FIGS. 1 and 3 and the characteristics of some of the circuit components, and;

FIG. 5 is a graph of the discriminator output as a function of difference frequency for a circuit such as that illustrated in FIG. 3 under various conditions.

Referring now to FIG. 1 there is illustrated a frequency difference discriminator employing two channels, labelled I and Q, having a predetermined phase relationship. Two mixers 10 and 11 are contained in the I and Q channels respectively. An input terminal 12 is adapted for the connection of input signals to one input of both mixers 10 and 11. A local oscillator 13 is directly connected to another input of mixer 10 and is connected to another input of mixer 11 through a phase shift means 14. The outputs of mixers 10 and 11 are connected through filters 15 and 16, respectively, to separate inputs of a phase detector or multiplier 17 which in turn has an output terminal 18.

The modification of prior art frequency difference discriminator, shown in FIG. 1, involves the placing of filter networks or wave-shaping networks 15 and 16 in both of the phase related channels I and Q. Prior art circuitry has generally employed a differentiating network in only one of these channels. The operation of these networks in this circuit will become evident upon considering the operation of the circuit of FIG. 3 which will be described in more detail later.

Figure 2:
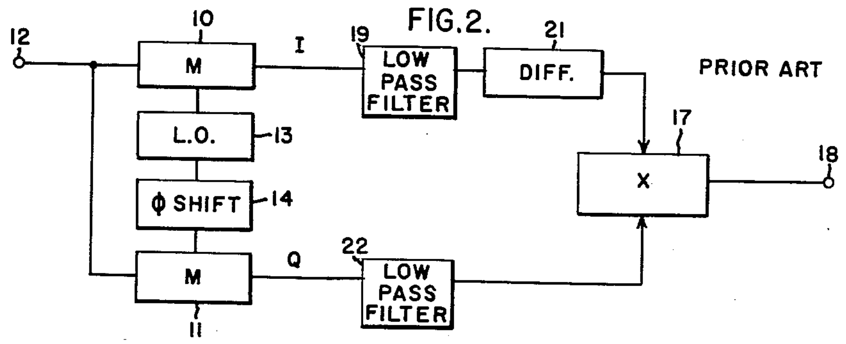
FIG. 2 is a block diagram of a prior art frequency difference discriminator.

Turning now to FIG. 2 there is illustrated a prior art embodiment of a frequency discriminator in which identical components to those in FIG. 1 have been given the same numbers used in FIG. 1. Thus, as illustrated, the frequency difference discriminator of FIG. 2 contains the two mixers 10 and 11 in the I and Q channels, provided with an input terminal 12 and fed by local oscillator 13 which is connected directly to mixer 10 and through phase shift means 14 to mixer 11. The networks connecting the outputs of mixers 10 and 11 to phase detector 17 are here shown as a low pass filter 19 connected in series with a differentiating circuit 21 between mixer 10 and one input of phase detector 17. A second low pass filter 22 is connected between mixer 11 and another input of phase detector 17. Terminal 18 again provides an output connection for phase detector 17.

One of the functions of the two low pass filters 19 and 22 is to remove high frequency noise components from the I and Q channels of the frequency difference discriminator. This is done so that when the inputs to the phase detector 17 are multiplied together there is no resultant beat frequency due to the high frequency noise components in the two channels and there is a resultant reduction in low frequency noise in the output at terminal 18. The low pass filters 19 and 22 in the prior art arrangement have taken the form of simple RC networks or capacitors alone selected to eliminate the carrier of the wave applied to the mixers 10 and 11, the sum heterodyne components developed in the mixers 10 and 11, and other noise components in that portion of the frequency spectrum. The prior art arrangement has been employed in intermediate frequency amplifiers wherein the bandpass limits of the amplifier have been considerably below the attenuating limits of the low pass filters. Accordingly, these prior art filters, while eliminating noise originating within the mixers 10 and 11, have little or no effect on eliminating noise already present within the intermediate frequency spectrum. The low pass filters 19 and 22 have a sharp cutoff characteristic and the differentiator 21 has to approach a perfect differentiator and is usually of a relatively involved design.

FIG. 3 illustrates another embodiment of the invention employing the simplest possible circuitry for performing the desired functions. Here again, like components have been given the same numbers as those used in FIGS. 1 and 2. Again, the discriminator consists of two channels, an I and Q channel, in this embodiment, specifically termed an inphase and a quadrature phase channel. Inphase channel I contains a balanced modulator or mixer 10 and quadrature phase channel Q contains a balanced modulator or mixer 11. Common input terminal 12 to modulators 10 and 11 is connected to the output of an intermediate frequency amplifier 24 which has an input terminal 25 adapted for connection to a source of input signals. In addition, local oscillator 13 is connected to another input of balanced modulator 10 and through a phase shift means 14, here shown to be a 90° phase shift, to another input of balanced modulator 11. The output of balanced modulator 10 in the I channel is connected to one input of phase detector 17 through a differentiating network consisting of a capacitor 26 and a resistor 27. The output of balanced modulator 11 in the Q channel is connected through an integrating network comprising resistor 28 and capacitor 29 to another input of phase detector 17. The output terminal 18 of phase detector 17 is connected to an input of a low pass filter 30 having an output terminal 31.

The purpose of the frequency difference discriminators illustrated in FIGS. 1–3 is to compare a weak signal with a strong local carrier, derived from the local oscillator 13, and to produce a D.-C. voltage at output terminal 18 proportional to the frequency difference of the input signal frequency and the frequency of the local oscillator 13. As mentioned previously, the prior art discriminators have contained a differentiator in the I channel of FIG. 3. However, here there is shown an additional integrating network, comprising resistor 28 and capacitor 29, in the Q channel. By adding such an integrator to the Q channel a very large signal-to-noise improvement may be obtained while the input-output signal characteristics may remain essentially unchanged. This is due to the fact that the integrator in the Q channel removes the bulk of the high frequency noise signal present therein, restraining it from beating against any high frequency component in the I channel in the phase detector 17, and resulting in a reduced low frequency noise content in the output of phase detector 17. The positions of the integrator and differentiator in FIG. 3 may be interchanged, placing the integrator in the I channel and the differentiator in the Q channel. The differentiator in the I channel has a characteristic equivalent to that of a low pass filter and a perfect differentiator combined and is accomplished with the use of very simple construction.

Cosidering a weak input signal, $S \cos w_i t$ and noise, to be applied to terminal 25 of FIG. 3 and amplified by IF amplifier 24, which has a center frequency $w_m$ and a bandwidth B, we have an amplified signal $S \cos w_i t$ at input terminal 12 to balanced modulators 10 and 11. The output of local oscillator 13 is set at $\cos w_m t$, having a frequency equal to the center frequency of IF amplifier 24. This is applied to one input of balanced modulator 10 and through a 90° phase shift, providing a signal $\sin w_m t$, to an input of balanced modulator 11. The resultant outputs of balanced modulators 10 and 11 can then be described as $$\frac{S}{2}\cos wt \text{ and } \frac{S}{2}\sin wt$$

respectively. If the integrator in the Q channel, comprising resistor 28 and capacitor 29, is designed to have a frequency response $$H_I = \frac{w_I}{w_I + jw} \quad (1)$$

and the differentiator in the I channel, comprising resistor 27 and capacitor 26, is designed to have a frequency response $$H_D = \frac{w}{w_D + jw} \quad (2)$$

then the signal response of the frequency difference discriminator at output terminal 31 when the input signal is $S \cos w_i t$ can be described as $$v_o = \frac{S^2}{8}\frac{xr(r+x^2)}{(1+x^2)(r^2+x^2)} \quad (3)$$

where $$x = \frac{w}{w_D}$$

$$w = w_m - w_i$$

$$r = \frac{w_I}{w_D}$$

$w_D$=the cutoff frequency of the I channel differentiator
$w_I$=the cutoff frequency of the Q channel integrator In the past this discriminator has been built with no integrator, that is, with $H_I=1$. This is equivalent to having $w_I$ approach $\infty$ or $r$ approach $\infty$. Then with no integrator the output is $$v_o(r \to \infty) = \frac{S^2}{8}\frac{x}{1+x^2} \quad (4)$$

Exactly the same output may be obtained by making the integrator time constant equal to the differentiator time constant, that is, $w_I = w_D$ and $r=1$. In this case $$v_o(r=1) = \frac{S^2}{8}\frac{x}{1+x^2} \quad (5)$$

Intermediate cases give different response curves. These are sketched in FIG. 5. However, the two conditions where $r$ is equal to 1 and approaches $\infty$ are the important cases and will be compared with situations involving noisy inputs.

Considering the noise response, the following applies when the signal to noise ratio measured at the output of IF amplifier 24 is small. In this case the noise output may be computed as if no signal were present. The power density of the noise in the vicinity of zero frequency is given for the two cases, $r=1$ and $r \to \infty$. These results are $$G_o(r=1) = \frac{w_D G_i^2}{2}\left[\tan^{-1}\left(\frac{B}{2w_D}\right) - \frac{B/2w_D}{2\left[1+\left(\frac{B}{2w_D}\right)^2\right]}\right] \quad (6)$$

$$G_o(r \to \infty) = \frac{w_D G_i^2}{2}\left[\frac{B}{2w_D} - \tan^{-1}\frac{B}{2w_D}\right] \quad (7)$$

These are double-ended spectrum measured at the phase detector output terminal 18 where $G_i$=input power density (double-ended) (watts/rad./sec.)
B=IF noise bandwidth (radians/second)

In obtaining these results it has been assumed that the IF amplifier 24 is an ideal band-pass filter. Often the IF bandwidth is much wider than that of the differentiator. In this case the above reduces to approximately $$G_o(r=1) \approx \frac{w_D G_i^2}{2}\left[\frac{\pi}{2} - \frac{w_D}{B}\right] \approx \frac{\pi}{4} w_D G_i^2 \quad (8)$$

$$G_o(r \to \infty) \approx \frac{w_D G_i^2}{2}\left[\frac{B}{2w_D} - \frac{\pi}{2}\right] \approx 1/4 B G_i^2 \quad (9)$$

The ratio of output noise power density is $$\frac{G_o(r \to \infty)}{G_o(r=1)} = \frac{B}{\pi w_D} \quad (10)$$

where B=IF bandwidth (rad./sec.)

This ratio is also approximately the improvement in signal-to-noise ratio obtained by adding the integrator. The conditions under which this improvement is obtained are small inputs signal-to-noise ratio and IF bandwith large compared to integrator bandwidth.

Figures 4A, 4B, 4C, 4D:
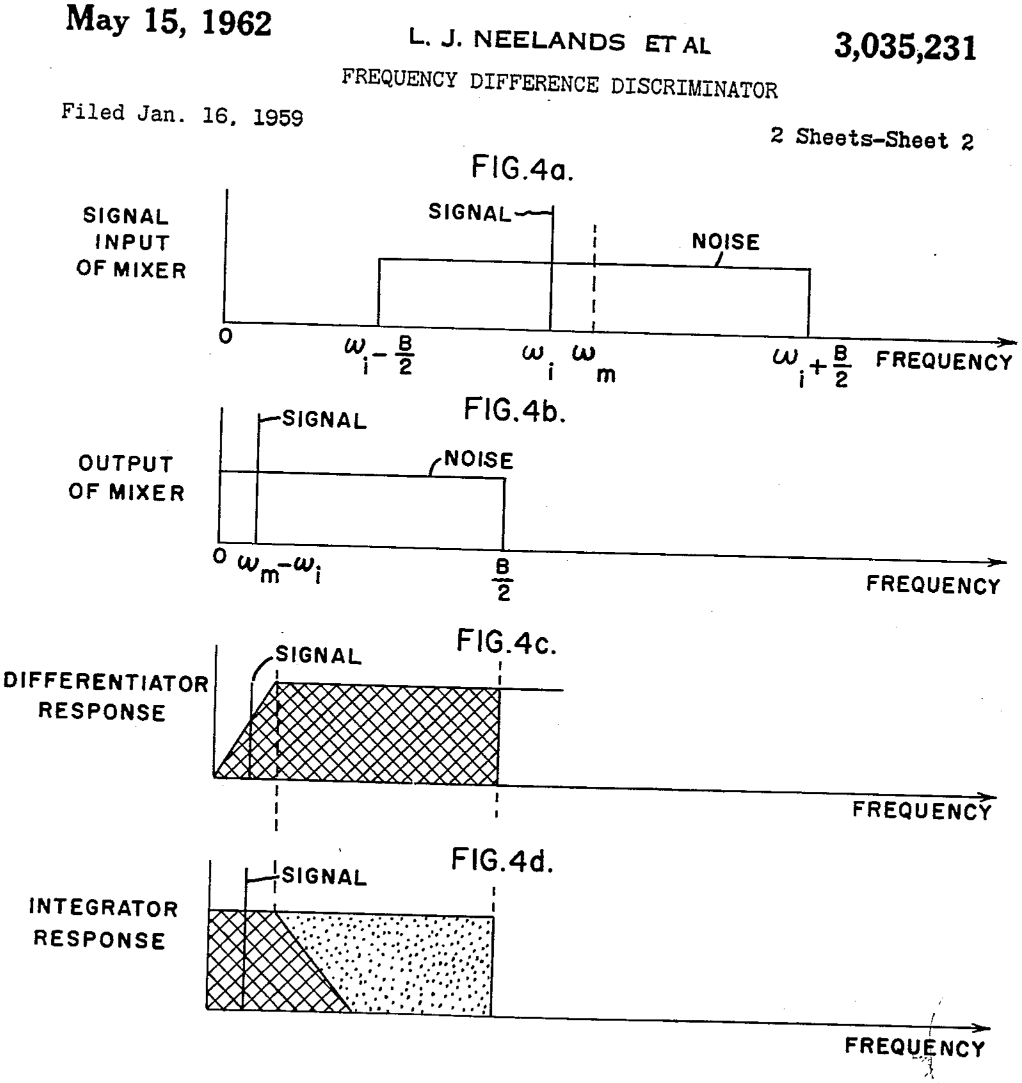

Referring to FIG. 4*a* the input to the mixer is shown. The intermediate frequency amplifier is centered at the local oscillator frequency $w_m$ and the signal frequency $w_i$ is offset. The noise spectrum has the shape of the intermediate frequency band-pass.

When this signal passes through the mixer, the output is as shown in FIG. 4*b*. The noise is centered at zero frequency and the signal appears at $w_m-w_i$.

FIG. 4*c* shows the response of the differentiator. FIG. 4*d* shows the integrator response having a time constant equal to that of the differentiator. FIGS. 4*c* and 4*d* show the noise content at the output as cross-hatched. In FIG. 4*d* the dotted portion represents noise that is rejected by the integrator. This represents a substantial portion of the total noise power and forms the basic reason for the signal-to-noise improvement.

To more fully appreciate this invention, the following explanation is presented. The present invention provides an advantage when one-half the bandwidth of the noise ($B/2$) is wider than the expected excursion of the signal frequency ($\omega_i-\omega_m$). In actual practice this condition often exists. The cut-off frequency of the differentiator ($\omega_D$) would normally be made about equal to the expected excursion of the signal frequency ($\omega_i-\omega_m$) in prior art devices to obtain a useful linear output from the devices. Also, in prior art devices, no integrator is utilized. In the present invention, the integrator with cut-off frequency $\omega_I$ is added, and the signal output is unchanged from that obtained in prior art devices when the relation holds that $\omega_I=\omega_D$. Thus, the cut-off frequency of the integrator ($\omega_I$) is approximately equal to the expected excursion of signal frequency ($\omega_i-\omega_m$). Since the excursion ($\omega_i-\omega_m$) is less than B/2, the cut-off frequency of the integrator ($\omega_I$) is also less than $B/2$. The more that $\omega_I$ is less than B/2, the more advantageous is the subject invention over prior art embodiments.

The integrator and differentiator response change linearly during one portion of the curve and remain constant elsewhere according to FIGURES 4*c* and 4*d*. This is merely a convenient approximate representation that is commonly used; in no way does this imply that such a response is necessary or desirable. According to this representation, the transition point occurs at the cut-off frequencies $\omega_D$ and $\omega_I$ for the differentiator and integrator, respectively. At these frequencies, the power gain is down by a factor of one-half from the maximum value. The true differentiator and integrator response or gain (on a power or voltage squared basis) is obtained from the equations 11 and 12.

$$|H_D|^2=\frac{\omega^2}{\omega_D^2+\omega^2} \qquad (11)$$

$$|H_I|^2=\frac{\omega_I^2}{\omega_I^2+\omega^2} \qquad (12)$$

Equations 11 and 12 are the gain equations for the differentiator and integrator, respectively. These gains are what FIGURES 4*c* and 4*d* represent approximately. It is to be observed that each term in the equations of the specification has been defined with relation to the figures except the cut-off frequencies $\omega_D$ and $\omega_I$. $\omega_D$ and $\omega_I$ have been defined in the above paragraph.

Although only unmodulated input signals have been discussed, the device is not limited to these signals. Frequency modulated signals could be detected so long as the modulation frequency remained below the cut-off frequency of the integrator.

While the principles of the invention have now been made clear in the illustrative embodiments, there will be immediately obvious to those skilled in the art many modifications in structure, arrangement, proportions, elements, components used in the practice of the invention, and otherwise, which are particularly adapted for specific environments and operating requirements without departing from these principles. The appended claims are therefore intended to cover and embrace any such modification within the limits only of the true spirit and scope of the invention.

What is claimed as the invention and desired to be secured by Letters Patent of the United States is:

1. In a frequency difference discriminator, an inphase and a quadrature phase channel each containing a mixer, means for supplying to each channel waves including signal and noise components lying within a predetermined frequency spectrum, a source of local oscillations central to said spectrum, quadrature phase shifting means, means connecting said source to one input of said inphase mixer, means connecting said source through said phase shifting means to one input of said quadrature phase mixer, a phase detector, a differentiator for waves lying within the spectrum as shifted in mixing, means connecting the output of one of said mixers through said differentiator to one input of said phase detector, an integrator for waves lying within the spectrum as shifted in mixing, and means connecting the output of the other of said mixers through said integrator to another input of said phase detector to reduce the noise content in the output of said discriminator.

2. In a frequency difference discriminator, an inphase and a quadrature phase channel each containing a mixer, means for supplying to each channel waves including signal and noise components lying within a predetermined frequency spectrum, a source of local oscillations central to said spectrum, quadrature phase shifting means, means connecting said source to one input of said inphase mixer, means connecting said source through said phase shifting means to one input of said quadrature phase mixer, a phase detector, means connecting the output of said inphase mixer through an RC differentiating network for differentiating waves lying within the spectrum as shifted in mixing to one input of said phase detector, and means connecting the output of said quadrature phase mixer through an RC integrating network for filtering out waves lying within the spectrum as shifted in mixing to another input of said phase detector to reduce the noise content in the output of said discriminator.

3. In a frequency difference discriminator, an inphase and a quadrature phase channel each containing a mixer, means for supplying to each channel waves including signal and noise components lying within a predetermined frequency spectrum, a source of local oscillations central to said spectrum, quadrature phase shifting means, means connecting said source to one input of said inphase mixer, means connecting said source through said phase shifting means to one input of said quadrature phase mixer, a phase detector, means connecting the output of one of said mixers through an RC differentiating network for waves lying within the spectrum as shifted in mixing to one input of said phase detector, and means connecting the output of the other said mixers through an RC integrating network for filtering out waves lying within the spectrum as shifted in mixing to another input of said phase detector to control the characteristics of said discriminator.

4. In combination, two phase related channels each containing a mixer, means for supplying waves including signal and noise components lying within a predetermined frequency spectrum to one input of each mixer, a source of local oscillations having a frequency substantially central to said spectrum, phase shifting means, means connecting said source to the other input of one mixer, means connecting said source through said phase shifting means to the other input of the other of said mixers, a multiplier, a differentiating network connecting the output of a first of said mixers to one input of said multiplier, and a low pass filter connected between the output of a second of said mixers and the other input of said multiplier, said low pass filter having a cut off frequency less than one half the bandwidth of said predetermined frequency spectrum.

5. The combination set forth in claim 4 wherein said differentiating network has a cut off frequency less than one half the bandwidth of said predetermined frequency spectrum and wherein said low pass filter has a low frequency cut off no less than said cut off frequency of said differentiating network.

6. The combination set forth in claim 5 wherein said low pass filter is an integrating network.

7. The combination set forth in claim 5 wherein said differentiating network is an RC network and wherein said low pass filter is an RC integrator.

References Cited in the file of this patent

UNITED STATES PATENTS 2,413,913 Duke ------------------ Jan. 7, 1947